(12) United States Patent
Maruyama et al.

(10) Patent No.: US 10,483,418 B2
(45) Date of Patent: Nov. 19, 2019

(54) PRIMER FOR SOLAR CELL MODULE AND SOLAR CELL MODULE

(71) Applicants: KABUSHIKI KAISHA TOYOTA JIDOSHOKKI, Kariya-shi, Aichi-ken (JP); TOYOTA JIDOSHA KABUSHIKI KAISHA, Toyota-shi, Aichi-ken (JP)

(72) Inventors: Yuya Maruyama, Kariya (JP); Hirotaka Inaba, Kariya (JP); Motoya Sakabe, Nissin (JP)

(73) Assignees: KABUSHIKI KAISHA TOYOTA JIDOSHOKKI, Kariya-shi, Aichi-ken (JP); TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 16/012,985

(22) Filed: Jun. 20, 2018

(65) Prior Publication Data

US 2019/0035960 A1 Jan. 31, 2019

(30) Foreign Application Priority Data

Jul. 26, 2017 (JP) .................. 2017-144679

(51) Int. Cl.
*H02N 6/00* (2006.01)
*H01L 31/042* (2014.01)
(Continued)

(52) U.S. Cl.
CPC .......... *H01L 31/0481* (2013.01); *C08L 43/04* (2013.01); *C09D 143/04* (2013.01);
(Continued)

(58) Field of Classification Search
CPC .................. H01L 31/0481; H01L 31/048
See application file for complete search history.

(56) References Cited

U.S. PATENT DOCUMENTS 4,795,775 A 1/1989 Baile et al.
5,109,064 A 4/1992 Wakabayashi et al.
(Continued)

FOREIGN PATENT DOCUMENTS

JP 2013-16626 A 1/2013
JP 2014-212268 A 11/2014

OTHER PUBLICATIONS

The Extended European Search report dated Dec. 7, 2018, issued by the European Patent Office in corresponding application No. 18175472.2.

(Continued)

*Primary Examiner* — Angelo Trivisonno
(74) *Attorney, Agent, or Firm* — Sughrue Mion, PLLC

(57) ABSTRACT

Provided is a primer for a solar cell module which makes it possible to prevent peeling of a surface protective material from a sealing material over a long time, and a solar cell module manufactured using this primer. The primer includes 40 to 95 parts by mass of a polymerizable ester, 5 to 60 parts by mass of an adhesion promoter, and a polymerization initiator. The polymerizable ester includes at least one of an acryloyl group and a methacryloyl group. The adhesion promoter includes a functional group improvable is adhesion to an acrylic resin or a methacrylic resin, and an alkoxysilyl group. The polymerization initiator is configured to be able to initiate polymerization of the polymerizable ester. The content of the polymerization initiator is 0.1 to 10 parts by mass based on 100 parts by mass as a total of the polymerizable ester and the adhesion promoter.

6 Claims, 1 Drawing Sheet

(51) Int. Cl.
  *H01L 31/048* (2014.01)
  *C09D 143/04* (2006.01)
  *C09J 143/04* (2006.01)
  *C08L 43/04* (2006.01)
  *C09J 4/06* (2006.01)
  *C09J 11/08* (2006.01)
  *C09J 123/02* (2006.01)
  *C09J 123/08* (2006.01)

(52) U.S. Cl.
  CPC ............... *C09J 4/06* (2013.01); *C09J 11/08* (2013.01); *C09J 123/025* (2013.01); *C09J 123/0853* (2013.01); *C09J 143/04* (2013.01); *H01L 31/048* (2013.01)

(56) References Cited

U.S. PATENT DOCUMENTS

| | | |
|---|---|---|
| 2009/0173384 A1 | 7/2009 | Ooi et al. |
| 2011/0098410 A1 | 4/2011 | Harumashi et al. |
| 2014/0109489 A1 | 4/2014 | Ohishi et al. |
| 2015/0110990 A1* | 4/2015 | Chou ............... B05D 3/067 428/76 |

OTHER PUBLICATIONS

Dow Corning Corporation: "Xiameter(R) Material Safety Data Sheet: Xiameter(R) OFS-6030 Silane", Version: 1.0, Revision Date: Jan. 20, 2009, Retrieved from the Internet: URL:https://www.b2bcomposites.com/msds/univar/580076.pdf [retrieved on Nov. 15, 2018], pp. 1-8.

* cited by examiner

PRIMER FOR SOLAR CELL MODULE AND SOLAR CELL MODULE

CROSS-REFERENCE TO RELATED APPLICATION

The present application claims priority under 35 U.S.C. § 119 to Japanese Application No. 2017-144679, filed on Jul. 26, 2017, entitled "PRIMER FOR SOLAR CELL MODULE AND SOLAR CELL MODUIE". The contents of this application are incorporated herein by reference in their entirety.

BACKGROUND

Field of the Invention

The present disclosure relates to a primer for a solar cell module and a solar cell module manufactured using the primer.

Description of the Related Art

A solar cell module includes a surface protective material provided on the side of a light receiving face, a back surface protective material provided on the opposite side of the light receiving face, and a sealing material provided between the surface protective material and the back surface protective material and having a solar cell sealed therein. The surface protective material is composed of glass that excels in weatherability, durability against scratching, and transparency. In a solar cell module to be mounted, for example, on a vehicle such as an automobile, a glass laminate formed by laminating a plurality of glass sheets via an adhesive has been used.

However, the glass and the glass laminate are relatively large in mass, and which causes increase of the mass of the solar cell module and eventually causes increase of the mass of a vehicle. For this reason, techniques for using a transparent resin instead of the glass or the glass laminate conventionally used as a surface protective material have been studied for the purpose of weight reduction of the solar cell module (Patent Document 1).

PRIOR ART LITERATURE

Patent Document

Patent Document 1
JP-A-2014-212268

SUMMARY

However, as a general tendency, a solar cell module having a surface protective material composed of a transparent resin, including the solar cell module disclosed in Patent Document 1, is inferior in various properties, for example, adhesion between the surface protective material and a sealing material, durability under high temperature environment, durability against cooling and heating cycle and so on in comparison with a conventional solar cell module having a surface protective material composed of glass, and thus it is problematic that the surface protective material is easily peeled off from the sealing material. Consequently, even now, the solar cell module having a surface protective material composed of a transparent resin has not been in practical use under severe environment, for example, for use in a vehicle.

The present disclosure has been made in view of this background to provide a primer for a solar cell module that makes it possible to prevent peeling of the surface protective material from the sealing material over a iong time, and a solar cell module manufactured using this primer.

One aspect of the present disclosure is a primer for a solar cell module, including:

40 to 95 parts by mass of a polymerizable ester including at least one of an acryloyl group and a metnacryloyl group;

5 to 60 parts by mass of an adhesion promoter including a functional group improvable in adhesion to an acrylic resin or a methacrylic resin, and an alkoxysilyl group; and a polymerization initiator for initiating polymerization of the polymerizable ester, the content of which being 0.1 to 10 parts by mass based on 100 parts by mass as a total of the polymerdzable ester and the adhesion promoter.

Another aspect of the present disclosure is a solar cell module including:

a solar cell provided with a light receiving face;

a sealing material that is composed of a transparent resin including a silane coupling agent and covers the periphery of the solar cell;

an adhesive material that is composed of a cured product of the primer according to claim 1 or 2, and is laminated on the sealing material at the side of the light receiving face of the solar cell;

a surface protective material that is composed of a transparent resin and is laminated on the adhesive material; and a mixture layer that is formed between the adhesive material and the surface protective material and is composed of a mixture of the adhesive material and the surface protective material.

The primer for a solar cell module (hereinafter referred to as "primer") contains the polymerizable ester having the above-mentioned specific functional group, the adhesion promoter having the above-mentioned specific functional groups, and the polymerization initiator in the above-mentioned specific ratios. In order to manufacture a solar cell module using the primer, for example, the following processes can be employed. First, the sealing material having a solar cell sealed therein and the surface protective material composed of a transparent resin are prepared. Next, the primer is applied to at least one of the surface protective material and the sealing material, thereafter the surface protective material and the sealing material are laminated on each other having the primer interposed therebetween to thereby form a laminate body. Subsequently, the laminate body is heated to bond the surface protective material and the sealing material via the adhesive material and the mixture layer. In this way, the solar cell module can be obtained.

The polesmerizable ester contained in the primer polymerizes by the polymerization initiator during the aforementioned bonding process to form a (meth)acrylic polymer. Because of existence of the (meth)acrylic polymer, the adhesive material can be mixed with the surface protective material spontaneously during the bonding process to thereby form the mixture layer. The mixture layer thus formed between the surface protective material and the adhesive material can enhance the adhesion between the surface protective material and the adhesive material.

The adhesion promoter has an alkoxysilyl group and a functional group improvable in adhesion to an acrylic resin or a methacrylic resin. The alkoxysilyl group in the adhesion promoter reacts with the silage coupling agent contained in the sealing material during the bonding process to thereby form a chemical bond. Further, the functional group in the adhesion promoter can form a chemical bond with the (meth)acrylic polymer derived from the polymerizable ester. In this way, the adhesion between the adhesive material and the sealing material can be enhanced.

As described above, by providing the adhesive material composed of the cured product of the primer and the mixture layer between the surface protective material and the sealing material in the solar cell module, the surface protective material and the sealing material can be firmly bonded to each other. In addition, the adhesive material and the mixture layer provided between the surface protective material and the sealing materal can improve durability under high temperature environment and durability against cooling and heating cycle. Thus, peeling of the surface protective material from the sealing material can be prevented over a long time.

DETAILED DPSCRIPTION OF THE EMBODIMENT

Figure 1:
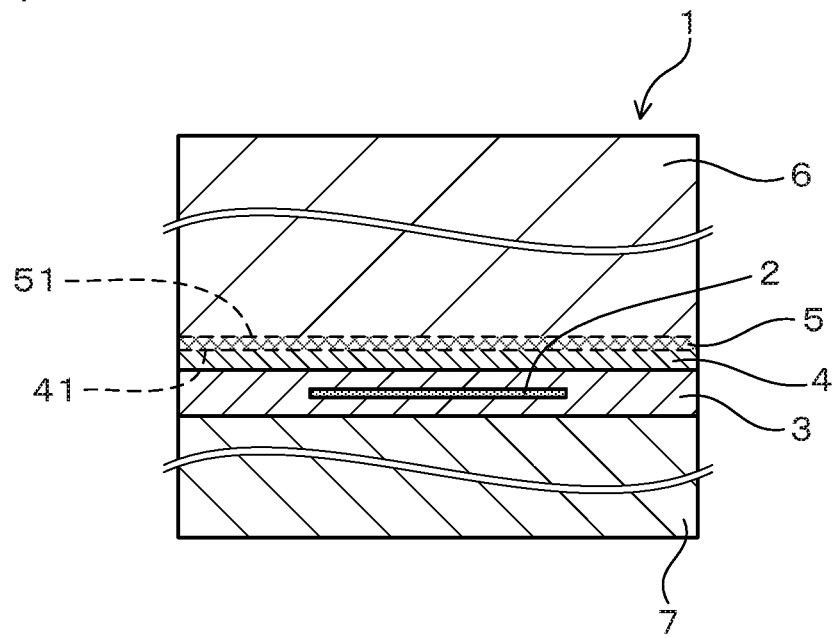
FIG. 1 is a fragmentary sectional view showing a substantial part of a solar cell module in an embodiment.

Components contained in the primer will be described.

Polymerizable Ester 40 to 95 parts by mass

The primer contains 40 to 95 parts by mass of a polymerizable ester including at least one of an acryloyl group and a methacryloyl group. Because the content of the polymerizable ester is set within the range specified as above, peeling of the surface protective material from the sealing material in the solar cell module can be prevented over a long time. In order to further enhance peel-strength of the surface protective material from the sealing material, the content of the polymerizable ester is preferably set to 40 to 80 parts by mass, and more preferably set to 40 to 60 parts by mass.

When the content of the polymerizable ester is less than 40 parts by mass, the mixture layer is hardly formed between the surface protective material and the adhesive material in the bonding of the surface protective material and the sealing material, so there is a risk that the adhesion between the surface protective material and the adhesive material may deteriorate.

Meanwhile, when the content of the polymerizable ester exceeds 95 parts by mass, there is a risk that the content of the adhesion promoter may be relatively lessened. As a result, there is a risk that the adhesion between the adhesive material and the sealing material may deteriorate.

As the polymerizable ester, previously known compounds, for example, an acrylate ester, a methacrylate ester and so on, which are polymerized by a polymerization initiator and are able to form a (meth)acrylic polymer, can be used.

As the polymerizable ester, the following compounds are specifically exemplified: a monoester including a methyl (meth) acrylate, an ethyl (meth) acrylate, a propyl (meth) acrylate, a 1-methylethyl (meth) acrylate, a butyl (meth) acrylate, a 2-methylpropyl (meth) acrylate, a 2-hydroxyethyl (meth)acrylate, a 2-hydroxypropyl (meth) acrylate, and so on; a diester including a 1,6-hexanediol di (meth) acrylate, a polyethylene glycol di (meth) acrylate, an isocyanuric acid ethylene oxide modified di (meth) acrylate, and so on; and an ester having at least three acryloyl groups, including a trimethyloipropane tri (meth) acrylate, a pentaerythritol tri (meth) acrylate, a pentaerythritol tetra (meth) acrylate, an isocyanuric acid ethylene oxide modified tri (meth) acrylate, and so on.

These polymerjzable esters can be used singly or in combination of two or more kinds. The polymerizable ester may be a monomer of the aforementioned compounds or an oligomer obtained by preliminarily polymerizing a plurality of monomers.

Adhesion Promoter 5 to 60 parts by mass

The primer contains 5 to 60 parts by mass of an adhesion promoter. Because the content of the adhesion promoter as set within the range specified as above, peeling of the surface protective material from the sealing material in the solar rell module can be prevented. over a long time. In order to further enhance peel-strength of the surface protective material from the sealing material, the content of the adhesion promoter is preferably set to 20 to 60 parts by mass, and more preferably set to 40 to 60 parts by mass.

When the content of the adhesion promoter is less than 5 parts by mass, there is a risk that the amount of the alkoxysilyl group to be contained. in the primer may be insufficient. As a result, it becomes difficult to form a chemical bond between the adhesion promoter and the silane coupling agent in the sealing material in the bonding process between the surface protective material and the sealing material, so there is a risk that the adhesion between the adhesive material and the sealing material may deteriorate.

Meanwhile, when the content of the adhesion promoter exceeds 60 parts by mass, there is a risk that the content of the polymerizable ester may be relatively lessened. As a result, there is a risk that the adhesion between the surface protective material and the adhesive material in the solar cell module may deteriorate.

The adhesion promoter has a functional group improvable in adhesion to an acrylic resin or a methacrylic resin, and an alkoxysilyl group. As the functional groups, for example, an epoxy group, a styryl group, an acryloyl group, a methacryloyl group, and an amino group are available. In order to prevent the peeling of the surface protective material from the sealing material over a longer time, an adhesion promoter containing at least one of an acryloyl group and a methacryloyl group as the aforementioned functional groups is preferably used.

Specifically, as the adhesion promoter, compounds having a (meth)acryloyl group and an alkoxysiiyi group, such as 3-(meth) acryloxypropyltrimethoxysilane, 3-(meth) acryloxypropyltriethoxysilane, and 3-(meth) acryloxypropylmethyldimethoxysilane can be used. These adhesion promoters can be used singly or in combination of two or more kinds.

Polymerization Initiator

The primer contains 0.1 to 10 parts by mass of a polymerization initiator with respect to 100 parts by mass of the polymersizable ester and the adhesion promoter in total. The polymerization initiator can generate active species such as an anion, a cation, a radical, and so on during the bonding process between the surface protective material and the sealing material. These active species initiate polymerization of the acryloyl group and the methacryloyl group in the polymerizable ester.

Because the content of the polymerization initiator is set within the range specified as above, the (meth)acrylic polymer can be formed in the aforementioned bonding process, so that the mixture layer composed of a mixture of the surface protective material and the adhesive material can be formed between the surface protective material and the adhesive material. Thus, the peeling of the surface protective material from the sealing material can be prevented over a long time.

When the content of the polymerization initiator is less than 0.1 parts by mass, it is difficult to polymerize the polymerizable ester in the bonding process. As a result, it becomes difficult to form the mixture layer between the surface protective material and the adhesive material, so that the peeling of the surface protective material from the sealing material cannot be prevented over a long time. In order to prevent the peeling of the surface protective material from the sealing material over a longer time, the content of the polymerization initiator is preferably set to 0.5 parts by mass or more, and more preferably set to 1 parts by mass or more.

Meanwhile, when the content of the polymerization initiator is excessively large, there is a risk that stability of the primer may deteriorate, for example, unintended polymerization may easily occur in the primer in storage. Also in this case, the polymerization initiator easily remains in the adhesive material in an unreacted state. When the amount of the unreacted polymerization initiator remaining in the adhesive material is excessively large, there is a risk that the deterioration of the adhesive material may be accelerated. Additionally, in such a case, there is also a risk that increase of raw material cost. may be caused. In order to prevent peeling of the surface protective material from the sealing material over a long time while avoiding these problems, the content of the polymerization initiator is set to 10 parts by mass or less. From the similar viewpoint, the content of the polymerization intiator is preferably 7 parts by mass or less, and more preferably 5 parts by mass or less.

As the polymerization initiator, for example, previously known polymerization initiators, for example, a photopolymerization initiator to generate active species by irradiation of light of a specific wavelength, a thermal polymerization initiator to generate active species by heating, and the like can be used. The primer may contain one kind of the polymerization initiator or two or more kinds of the polymerization initiators.

As the photopolymerization initiator, the following compounds are exemplified: an acetophenone compound including 2,2-dimethoxy-1,2-diphenylethan-1-one, 1-hydroxycyclohexyl phenyl ketone, 2-hydroxy-2-methyl-1-phenyl-propan-1-one, 1-[4-(2-hydroxyethoxy)-phenyl]-2-hydroxy-2-methyl-1-propan-1-one, 2-methyl-1-[4-(methylthio) phenyl]-2-morpholinopropan-1-one, 2-benzyl-2-dimethylamino-1-(4-morpholinophenyl)-butan-1-one, diethoxyacetophenone, oligo {2-hydroxy-2-methyl-1-[4-(1-methylvinyl) phenyl] propanone}, 2-hydroxy-1-{4-[4-(2-hydroxy-2-methylpropionyl) benzyl] phenyl}-2-methylpropan-1-one, and so on; a benzophenone compound including benzophenone, 4-phenylbenzophenone, 2,4,6-trimethylbenzophenone, 4-benzoyl-4'-methyldiphenylsulfide, and so on; an α-keto ester compound including methyl benzoylformate, 2-(2-oxo-2-phenylacetoxyethoxy) ethyl ester of oxyphenylacetic acid, 2-(2-hydroxyethoxy) ethyl ester of oxyphenylacetic acid, and so on; a phosphine oxide compound including 2,4,6-trimethylbenzoyl diphenylphosphine oxide, bis (2,4,6-trimethylbenzoyl) phenylphosphine oxide, bis (2,6-dimethoxybenzoyl)-2,4,4-trimethylpentylphosphine oxide, and so on; a benzoin compound including benzoin, benzoin methyl ether, benzoin ethyl ether, benzoin isopropyl ether, benzoin isobutyl ether, and so on; a titanocene compound; an acetophenone/benzophenone hybrid photoinitiator including 1-[4-(4-benzoylphenylsulfanyl) phenyl]-2-methyl-2-(4-methylphenylsulfinyl) propan-1-one, and so on; an oxime ester photopolymerization initiator including 2-(O-benzoyloxime)-1-[4-(phenylthio)]-1,2-octanedione, and so on; a camphaquinone, and so on.

As the thermal polymerization initiator, a thermal radical polymerization initiator to generate a radical as the active species, for example, an organic peroxide, an azo compound and so on can be used.

As the organic peroxide, the following compounds are exemplified: 1,1-bis (t-butylperoxy) 2-methylcyclohexane, 1,1-bis (t-hexylperoxy)-3,3,5-trimethylcyclohexane, 1,1-bis (t-hexylperoxy) cyclohexane, 1,1-bis (t-butylperoxy)-3,3,5-trimethylcyclohexane, 1,1-bis (t-butylperoxy) cyclohexane, 2,2-bis [4,4-di (t-butylperoxycyclohexyl)] propane, 1,1-bis (t-butylperoxy) cyclododecane, t-hexylperoxyisopropyl monocarbonate, t-butylperoxy maleic acid, t-butylperoxy-3,5,5-trimethylhexanoate, t-butylperoxy laurate, 2,5-dimethyl-2,5-di (m-toluoylperoxy) hexane, t-butylperoxyisopropyl monocarbonate, t-butylperoxy 2-ethylhexylmonocarbonate, t-hexylperoxy benzoate, 2,5-dimethyl-2,3-di (benzoylperoxy) hexane, t-butylperoxy acetate, 2,2-bis (t-butylperoxy) butane, t-butylperoxy benzoate, n-butyl-4,4-bis (t-butylperoxy) valerate, di-t-butylperoxylsophthalate, α, α'-bis (t-butylperoxy) diisopropylbenzene, dicumylperoxide, 2,5-dimethyl-2,5-di (t-butylperoxy) hexane, t-butylcumylperoxide, di-t-butylperoxide, p-menthane hydroperoxide, 2,5-dimethyl-2,5-di (t-butylperoxy) hexyne-3, diisopropylbenzene hydroperoxide, t-butyltrimethylsilyl peroxide, 1,1,3,3-tetramethylbutyl hydroperoxide, cumene hydroperoxide, t-hexyl hydroperoxide and t-butyl hydroperoxide.

As the azo compound, 1,1'-azobis (cyclohexane-1-carbonitrile), 2-(carbamoylazo) isobutyronitrile, 2-phenylazo-4-methoxy-2,4-dimethylvaleronitrile, octane, azodi-t-butane and so on are exemplified.

Other Additives

In addition to the polymerizable ester, the adhesion promoter, and the polymerization initiator as indispensable components in the primer, previously known additives for a primer may be contained within a range not impairing the adhesion to the surface protective material and to the sealing material. The additives for preventing deterioration of the primer, for example, an ultraviolet absorber, a thermal stabilizer, an antioxidant, a light stabilizer, and so on can be contained in the primer. Use of these additives makes it. possible to prevent deterioration of the cured product of the primer and to prevent the peeling of the surface protective material from the sealing material over a long time.

Additionally, the primer may contain a surface conditioner as an additive, such as a leveling agent, a defoaming agent, and so on. Use of these additives makes it possible to uniform the thickness of the primer applied on the surface(s) of the sealing material and/or the surface protective material. Thus, it is possible to reduce unevenness of the peel-strength of the surface protective material peeling from the sealing material.

In preparation of a solar cell module using the primer, the primer is applied on the surface of either one of the surface protective material composed of a transparent resin and the sealing material having the solar cell sealed therein, and then the surface protective material and the sealing material are laminated on each other having the primer interposed therebetween to thereby form a laminate body. Subsequently, the laminate body is heated to bond the surface protective material and the sealing material to produce the solar cell module.

The solar cell module thus produced includes a solar cell provided with a light receiving face;

a sealing material that is composed of a transparent resin including a silage coupling agent and covers the periphery of the solar cell;

an adhesive material that is composed of a cured product of the primer, and is laminated on the sealing material at the side of the light receiving face of the solar cell;

a surface protective material that is composed of a transparent resin and is laminated on the adhesive material.

The adhesive material contains a polymer derived from the polymerizble ester. Between the surface protective material and the adhesive material, a mixture layer composed of a mixture of the surface protective material and the adhesive material is formed.

As the solar cell, previously known solar cells, i.e., a solar cell provided with a silicon-based semiconductor such as polycrystalline silicon, monocrystalline silicon, amorphous silicon, or the like, a solar cell provided with a compound semiconductor such as copper indium selenide, gallium arsenide, or the like, and a solar cell provided with a organic semiconductor, or the like can be used.

The sealing material is composed of a transparent resin including a silane coupling agent. The thickness of the sealing material can be set to, for example, 0.5 to 3 mm. As the transparent resin is the sealing material, for example, an ethylene vinyl acetate copolymer (EVA), a polyolefin, a silicone resin, an ionomer resin, and so on can be used. As the silane coupling agent in the sealing material, a compound adapted to the substance of the transparent resin can be adopted for use from among the previously known silane coupling agents.

The surface protective material is composed of a transparent resin. The thickness of the surface protective material can be set to, for example, 3 to 5 mm.

As the transparent resin for the surface protective material, a transparent resin having a solubility parameter (SP value) of 9 to 22 can be used. Because the transparent resin having the above specified SP value excels in compatibility with the (meth)acrylic polymer in the adhesive material, the mixture layer composed of a mixture of the surface protective layer and the adhesive material can be easily formed between the surface protective material and the adhesive material. Consequently, the peeling of the surface protective material from the sealing material can be prevented over a longer time.

Specifically as the transparent resin for the surface protective material, transparent resins such as a polycarbonate (PC), a polymethylmethacrylate (PMMA), a polyethylene terephthalate (PET), a polypropylene (PP), and so on, can be used. Among these compositions, the polycarbonate is preferably used as the transparent resin in the surface protective material because of its excellent impact resistance.

The surface protective material may have a barrier layer for preventing permeation of water vapor on at least one of its light incident surface and its adhesive material side surface in the lamination direction of the solar cell module. In this case, the barrier layer prevents the permeation of water vapor from the light receiving face into the inside of the solar cell module to thereby improve the weatherability of the solar cell module.

As the barrier layer, for example, an oxide film mainly composed of an oxide of, for example, Si (silicon), Al (aluminum), Mg (magnesium), Ca (calcium), K (potassium), Sn (tin), Na (sodium), B (boron), Ti (titanium), Pb (lead), Zr (zirconium), Y (yttrium), and so on; a ceramics film composed of SiOx (silicon oxide), SiN (silicon nitride), and so on; a carbon film composed of diamond-like carbon, and so on can be used. These films may be formed directly on the surface protective material, or may be formed on a resin film separately prepared to laminate on the surface protective material.

In order to further improve the weatherability and/or the durability against scratching is the solar cell module, a hard coat material may be further laminated on the surface protective material. As the hard coat material, previous known coating agents for further improving weatherability and/or durability against scratching can be used.

Between the surface protective material and the sealing material, the adhesive material composed of a cured product of the primer is provided. The thickness of the adhesive material may be set to, for example, 1 to 5 µm.

Between the surface protective material and the adhesive material, a mixture layer composed of a mixture of the adhesive material and the surface protective layer is formed. Specifically, the mixture layer has a microphase separation structure, i.e. a sea-island structure having either one of the surface protective material and the adhesive material dispersed in another one, a gyroid structure in which either one of the surface protectjve material and the adhesive material forms meshes and another one is filled in voids formed by the meshed material, or other structures.

The mixture layer has a thickness preferably of 0.5 µm or more. In this case, the adhesion between the surface protective material and the adhesive material can be further enhanced. Consequently, the peeling of the surface protective material from the sealing material can be prevented over a longer time. It is noted that although the thickness of the mixture layer has no specific upper limit, the thickness is usually 0.5 µm or less in the case of using the primer.

The solar cell module may further have a back surface protective material for protecting a rear surface of the sealing material, i.e. the surface opposite to the light receiving face in the lamination direction. The thickness of the back surface protective material may be set to, for example, 1 to 3 mm. As the back surface protective material, resins such as a polycarbonate (PC), a polymethylmethacrylate (PMMA), a polyethylene terephthalate (PET), a polypropylene (PP), and so on, and previously known materials for a back surface protective material can be used.

The back surface protective material may be laminated directly on the sealing material, or may be laminated on the sealing material via a rear face adhesive material composed of the cured product of the primer. In the latter case, it is preferable that the mixture layer composed of the mixture of the back surface protective material and the rear face adhesive material is formed between the back surface protective material and the rear face adhesive material. In this case, for the same reason as described above with regard to the surface protective material, the mixture layer thus formed can enhance the adhesion between the sealing material and the rear face adhesive material, and the adhesion between the rear face adhesive material and the back surface protective material. Thus, the peeling of the back surface protective material from the sealing material can be prevented over a long time.

In addition, on one side or both sides of the back surface protective material, the aforementioned barrier layer may be formed. In this case, the barrier layer prevents permeation of water vapor from the rear face into the inside of the solar cell module to thereby further improve the weatherability of the solar cell module.

Embodiment

An embodiment of the primer and the solar cell module will be described with reference to FIG. 1. As shown. in FIG. 1, a solar cell module 1 of the present embodiment includes a solar cell 2; a sealing material 3 that is composed of a transparent resin including a silane coupling agent and covers the periphery of the solar cell 2; an adhesive material 4 that is composed of a cured product of a primer and is laminated on the sealing material 3 at the side of the light receiving face of the solar cell 2; a surface protective material 6 that is composed of a transparent resin and is laminated on the adhesive material 4. Between the adhesive material 4 and the surface protective layer 6, a mixture layer 5 composed of a mixture of the adhesive material 4 and the surface protective material 6 is formed. It is noted that because a boundary 41 between the adhesive material 4 and the mixture layer 5 and a boundary between the mixture layer 5 and the surface protective material 6 may not clearly appear in some cases, these boundaries 41 and 51 are shown in a broken line in FIG. 1. Hereinafter, the configuration of the solar cell module 1 will be described in more detail.

The solar cell module 1 according to the present embodiment, as shown in FIG. 1, is of a four-layer structure including a back surface protective material 7, the sealing material 3, the adhesive material 4, and the surface protective material 6 with being laminated in this order. The solar cell 2 is sealed in the sealing material 3. The sealing material 3 contains a polyolefin as the transparent resin and a silane coupling agent. The surface protective material 6 is composed of a polycarbonate as the transparent resin.

The adhesive material 4 is composed of a cured product of the primer including 40 to 95 parts by mass of a polymerizable ester, 5 to 60 parts by mass of an adhesion promoter, and a polymerization initiator. The polymerizable ester in the primer includes at least one of an acryloyl group and a methacryloyl group. The adhesion promoter includes a functional group that is improvable in adhesion to an acrylic resin or a methacrylic resin, and an alkoxysilyl group. The polymerization initiator is configured to be able to initiate polymerization of the polymerzable ester. The content of the polymerization initiator is 0.1 to 10 parts by mass based on 100 parts by mass as a total of the polymerizable ester and the adhesion promoter.

The solar cell module 1 of the present embodiment can be produced, for example, in the following manner. First, the sealing material 3 having the solar cell 2 sealed therein, the surface protective material 6, and the back surface protective material 7 are prepared. Next, the primer is applied to at least one of the surface protective material 6 and the sealing material 3. And, the back surface protective material 7, the sealing material 3, and the surface protective material 6 are laminated in this order to form a laminate body having the primer positioned between the surface protective material 6 and the sealing material 3. The back surface protective material 7 and the sealing material 3 are bonded to each other by heating this laminate body with being compressed in the lamination direction.

The above-mentioned heating initiates polymerization of the polymerizable ester in the primer. Thus, the adhesive material 4 containing a (meth) acrylic polymer is formed between the sealing material 3 and the surface protective material 6. At this time, part, of the adhesive material 4 mixed with the surface protective material 6 spontaneously to form the mixture layer 5 between the adhesive material 4 and the surface protective material 6. Further, the alkoxysilyl group in the adhesion promoter of the primer reacts with the silane coupling agent contained in the sealing material 3 to form a chemical bond.

As described above, by heating the laminate body with being compressed in the lamination direction, the adhesive material 4 and the mixture layer 5 are formed between the surface protective material 6 and the sealing material 3, so that surface protective material 6 and the sealing material 3 are bonded to each other. In. this way, the solar cell module 1 as shown in FIG. 1 can be obtained.

Because the solar cell module 1 produced using the primer of the present embodiment has the adhesive material 4 composed of the cured product of the primer and the mixture layer 5 provided between the surface protective material 6 and the sealing material 3, the surface protective material 6 and the sealing material 3 can be firmly bonded to each other. In addition, by providing the adhesive material 4 and the mixture layer 5 between the surface protective material 6 and the sealing material 3, durability under high temperature environment, durability against cooling and heating cycle can be improved. Thus, peeling of the surface protective material 6 from the sealing material 3 can be prevented over a long time.

(Experimental Example)

In this experimental example, specimens (refer to Specimens 1 to 9 in Tables 1 and 2) were prepared simulating a solar cell module with modifications of a composition of the primer/a material of the sealing material, and evaluations of shear bond strength, peel bond strength in peeling at 180°, heat resistance, and durability against cooling and heating cycle were performed. It is noted that the contents of the polymerization initiator listed in Tables 1 and 2 are based on 100 parts by mass of the polymers able ester and the adhesion promoter in total, Among Specimens 1 to 9, Specimens 8 and 9 are examples for simulating conventional solar cell modules produced without using any primer. The materials used in the present embodiment are as follows.

---
Polymerizable Ester
M-315 (manufactured by TOAGOSEI CO., LTD.)
Adhesion Promoter
XIAMETER ® OFS-6030 Silane (manufactured by Dow Corning Corp.)
Polymerization Initiator
IRGACURE ® 819 (manufactured by BASF SE)
---

Evaluation of Shear Bond Strength

A surface protective material, a back surface protective material, both composed of a polycarbonate, and four sheets of sealing material containing a transparent resin and a silane coupling agent shown in Tables 1 and 2 were prepared. It is noted that the surface protective material is of a square shape with each side of 165 mm and has a thickness of 2.7 mm. The back surface protective material is of a square shape with each side of 165 mm and has a thickness of 1.5 mm. The sealing material is of a square shape with each side of 155 mm and has a thickness of 550 μm.

On one side of the surface protective material and one side of the back surface protective materal, a primer listed in Tables 1 and 2 is applied, and then the four sheets of the sealing material were laminated on the primer on the back surface protective material. Subsequently, the surface protective material was laminated on the sealing material such that the surface having the primer applied thereon was in contact with the sealing material, to thereby form a laminate body. The laminate body was heated with being compressed in the lamination direction to thereby bond the components constituting the laminate body to each other.

Figure 2:
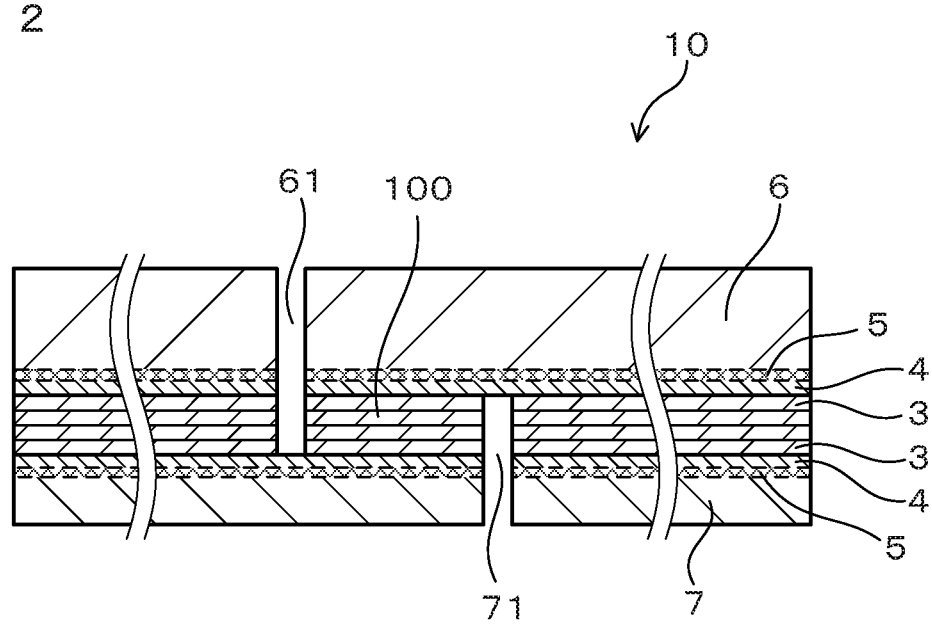
FIG. 2 is a fragmentary sectional view of a test piece used for evaluation of a shear bond strength in an experimental example.

A small piece was cut from the laminate body thus formed by bonding so as to have a length of 75 mm and a width of 10 mm. As shown in FIG. 2, at the center part of the small piece in the longitudinal direction, a notch 61 extending from the surface protective material 6 to the boundary between the sealing material 3 and the adhesive material 4 on the side of the back surface protective material 7, and a notch 71 extending from the back surface protective material 7 to the boundary between the sealing material 3 and the adhesive material 4 on the side of the surface protective material 6 were formed, and between these two notches 61 and 71, a bonding portion 100 was formed in a length of 5 mm.

A test piece 10 thus obtained (refer to FIG. 2) was used to measure a tensile shear bond strength by a method in accordance with JIS K 6850:1999. The tensile shear strength (MPa) of each specimen was as shown in Table 1.

Evaluation of Peel Bond Strength in Peeling at 180°

A laminate body was prepared in the same way as in preparation of the test piece for measurement of a shear bond strength except that a release sheet was attached to one side of the surface of the surface protective material having the primer applied thereto and a back sheet was provided between the back surface protective material and the sealing material. The back sheet and four sheets of the sealing material, and the surface protective material were bonded to each other by heating the laminate body while compressing in the lamination direction.

The back surface protective material was removed from the laminate body formed by bonding, and at the same time, the release sheet was peeled off from the surface protective material to form a peeling margin on one side of the sealing material separated from the surface protective material. Thereafter, a small piece was cut from the laminate body so as to have a length of 130 mm and a width of 10 mm to thereby prepare a test piece for use in evaluation of peel bond strength in peeling at 180°.

The test piece thus obtained was subjected to 180° peeling test by a method in accordance with JIS Z 0237:2009, by which the four sheets of the sealing material and the back sheet were peeled off from the surface protective material. The peeling rate of the sealing material was set to 50 mm/min. The peel bond strength in peeling at 180° (N/10 mm) of each specimen was as shown in Table 1.

Evaluation of Heat Resistance

A surface protective material and a back surface protective material, both composed of a polycarbonate, four sheets of sealing material containing a transparent resin listed in Tables 1 and 2 and a silane coupling agent, and three sheets of solar cell strings connected to each other via an interconnector were prepared. It is noted that the surface protective material is of a rectangular shape with a length of 500 mm, a width of 165 mm, and a thickness of 2.7 mm. The back surface protective material is of a rectangular shape with a length of 500 mm, a width of 165 mm, and a thickness of 1.5 mm. The sealing material is of a rectangular shape with a length of 490 mm, a width of 155 mm, and a thickness of 550 μm.

On one side of the surface protective material and one side of the back surface protective material, a primer listed in Tables 1 and 2 are applied, and then two sheets of the sealing material, the solar cell strings, and two sheets of the sealing material were laminated on the primer on the back surface protective material in this order. Subsequently, the surface protective material was laminated on the sealing material such that the surface having the primer applied thereon was in contact with the sealing material, to thereby form a laminate body. The components constituting the laminate body were bonded to each other by heating the laminate body while compressing in the lamination direction. In this way, a test piece for use in evaluation of the heat resistance was obtained.

The test piece thus obtained was heated for 240 hours using arm oven the furnace temperature of which was set to 120° C. and taken. out from the oven. Then, the adhesion state between the surface protective material and the sealing material was visually observed. Cases, in which the entire surface of the sealing material was bonded to the surface protective material, are marked in the column "Heat Resistance" in Tables 1 and 2 with "A", meanwhile, a case, in which at least part of the sealing material was peeled off from the surface protective material, is marked in the column with "B".

In the evaluation of heat resistance, the cases of being marked with "A" were determined to be acceptable as being excellent in heat resistance, meanwhile the case of being marked with "B" was determined not to be acceptable as being poor in heat resistance.

Evaluation of Durability against Cooling and Heating Cycle

A test piece was prepared in the same way as in the evaluation of heat resistance. The test piece was maintained in the environment at the temperature of −30° C. for an hour and then maintained in the environment at the temperature of 110° C. for an hour in one cycle, and this cycle was repeatedly carried out 100 times to perform a cooling and heating cycle test using a cooling and heating cycle testing machine. After completion of 100 cycles, the test piece was taken out from the testing machine, and the adhesion state between the surface protective material and the sealing material in the test piece was visually observed. Cases, in which the entire surface of the sealing material was bonded to the surface protective material, are marked in the column "Durability against Cooling and Heating Cycle" in Tables 1 and 2 with. "A", meanwhile, cases, in which at least part of the sealing material was peeled off from the surface protective material, are marked in the column with "B".

In the evaluation of durability against cooling and heating cycle, the cases of being marked with "A" were determined to be acceptable as being excellent in durability against cooling and heating cycle, meanwhile, the case of being marked with "B" was determined not to be acceptable as being poor in durability against cooling and heating cycle.

TABLE 1

|  |  | Specimen 1 | Specimen 2 | Specimen 3 | Specimen 4 | Specimen 5 |
|---|---|---|---|---|---|---|
| Sealing Material |  | EVA | Polyolefin | Polyolefin | Polyolefin | Polyolefin |
| Polymerizable Ester | Parts by mass | 50 | 50 | 80 | 95 | 40 |
| Adhesion Promoter | Parts by mass | 50 | 50 | 20 | 5 | 60 |

TABLE 1-continued

|  |  | Specimen 1 | Specimen 2 | Specimen 3 | Specimen 4 | Specimen 5 |
|---|---|---|---|---|---|---|
| Polymerization Initiator | Parts by mass | 2 | 2 | 2 | 2 | 2 |
| Shear Bond Strength | MPa | 2.8 | 2.8 | 2.4 | 2.4 | 3 |
| Peel Bond Strength in peeling at 180° | N/10 mm | 96.1 | 148.7 | 110.2 | 69.4 | 163.5 |
| Heat Resistance |  | A | A | A | A | A |
| Durability against Cooling and Heating Cycle |  | A | A | A | A | A |

TABLE 2

|  |  | Specimen 6 | Specimen 7 | Specimen 8 | Specimen 9 |
|---|---|---|---|---|---|
| Sealing Material |  | Polyolefin | Polyolefin | EVA | Polyolefin |
| Polymerizable Ester | Parts by mass | 60 | 100 | — | — |
| Adhesion Promoter | Parts by mass | 40 | 0 | — | — |
| Polymerization Initiator | Parts by mass | 2 | 2 | — | — |
| Shear Bond Strength | MPa | 3.8 | 3.5 | 2.3 | 0.8 |
| Peel Bond Strength in peeling at 180° | N/10 mm | 181.3 | 159.2 | 45.3 | 0.9 |
| Heat Resistance |  | A | A | B | A |
| Durability against Cooling and Heating Cycle |  | A | B | B | A |

As shown in Tables 1 and 2, the primers used in Specimens 1 to 6 include the polymerizable ester, the adhesion promoter and the polymerization initiator of which the contents are within the aforementioned specific ranges. Thus, these specimens were higher in peel bond strength in peeling at 180° in comparison with Specimen 7 prepared using the primer not containing the adhesion promoter, and Specimens 8 and 9 prepared without using any primer. In addition, Specimens 1 to 6 are excellent also in both of heat resistance and durability against cooling and heating cycle.

From these results, it can be understood that use of the primer nrludinq the polymerizable ester, the adhesion promoter, and the polymerization initiator of which the contents are within the aforementioned specific ranges enhances the adhesion between the sealing material and the surface protective material and prevents the peeling of the surface protective material from the sealing material over a long time.

The primer and the solar cell module according to the present invention are not limited to the aspects of the aforementioned embodiment (s) and the comparative example, and can be changed in configuration within the scope that does not depart from the scope and spirit of the present invention.

The invention claimed is:

1. A primer for a solar cell module, comprising:
   40 to 95 parts by mass of a polymerizable ester including at least one of an acryloyl group and a methacryloyl group;
   5 to 60 parts by mass of an adhesion promoter including a functional group that is improvable in adhesion to an acrylic resin or a methacrylic resin, and an alkoxysilyl group; and
   a polymerization initiator for initiating polymerization of the polymerizable ester, the content of which being 0.1 to 10 parts by mass based on 100 parts by mass as a total of the polymerizable ester and the adhesion promoter.

2. The primer for a solar cell module according to claim 1, wherein the adhesion promoter includes at least one of an acryloyl group and a methacryloyl group as the functional group.

3. A solar cell module comprising:
   a solar cell provided with a light receiving face;
   a sealing material that is composed of a transparent resin including a silane coupling agent and covers the periphery of the solar cell;
   an adhesive material that is composed of a cured product of the primer according to claim 1, and is laminated on the sealing material at the side of the light receiving face of the solar cell;
   a surface protective material that is composed of a transparent resin and is laminated on the adhesive material; and
   a mixture layer that is formed between the adhesive material and the surface protective material and is composed of a mixture of the adhesive material and the surface protective material.

4. The solar cell module according to claim 3, wherein the mixture layer has a thickness of 0.5 µm or more.

5. The solar cell module according to claim 3, wherein the surface protective material is composed of a polycarbonate as the transparent resin.

6. The primer for a solar cell module according to claim 1, wherein the primer contains 40 to 80 parts by mass of the polymerizable ester and 20 to 60 parts by mass of the adhesion promoter.

* * * * *